United States Patent [19]
Lejeune et al.

[11] Patent Number: 5,838,555
[45] Date of Patent: Nov. 17, 1998

[54] TWO-WIRE POWER SUPPLY ELECTRONIC SWITCH

[75] Inventors: Pascal Lejeune, Limoges; Dominique Selas, Pau, both of France

[73] Assignees: Legrand; Legrand SNC, both of Limoges, France

[21] Appl. No.: 936,622

[22] Filed: Sep. 24, 1997

[30] Foreign Application Priority Data

Oct. 11, 1996 [FR] France ................................... 96 12469

[51] Int. Cl.⁶ .............................. H02M 1/12; H02M 5/42; H02M 7/155; H02H 7/125

[52] U.S. Cl. .............................. 363/49; 363/86; 363/128; 363/54

[58] Field of Search ................................ 363/49, 54, 125, 363/126, 128, 85, 86

[56] References Cited

U.S. PATENT DOCUMENTS

| | | | |
|---|---|---|---|
| 4,321,662 | 3/1982 | Yokoyama | 363/86 |
| 4,910,654 | 3/1990 | Forge | 363/49 |
| 5,303,137 | 4/1994 | Peterson | 363/49 |

OTHER PUBLICATIONS

H. Hodgson—Electronic Engineering "A triac assisted noiseless power switch concept" vol. 61, No. 753, Sep. 1, 1989, pp. 25/26 XP000066064 *p. 26, left hand col., line 21—right hand col., line 26, figure 3*.

*Primary Examiner*—Peter S. Wong
*Assistant Examiner*—Bao Q. Vu
*Attorney, Agent, or Firm*—Young & Thompson

[57] ABSTRACT

A two-wire power supply switch connected in series with a load between two poles of an alternating current mains electrical power supply conventionally includes a main triac between two terminals of the switch which is turned on by the conduction of an optotriac with a time-delay relative to the zero crossing of the voltage between the switch terminals determined by the breakdown voltage of a series of Zener diodes. The switch includes a power supply unit with a rectifier bridge connected to one terminal directly and connected to the other terminal via a capacitor. An auxiliary triac shunting the capacitor is turned on by the optotriac on each zero crossing of the voltage between the switch terminals. This optimizes conditions when the switch is open and when the switch is closed separately.

6 Claims, 1 Drawing Sheet

TWO-WIRE POWER SUPPLY ELECTRONIC SWITCH

BACKGROUND OF THE INVENTION

1. Field of the Invention

The invention concerns a switch to be connected in series with a load between two poles of an alternating current mains electrical power supply, having two terminals to be connected to one pole of the mains supply and to the load, respectively, the load being connected to the other pole of the mains supply, and including a triggered bidirectional conduction main switch connected between the two switch terminals and a controller adapted, in response to an active state of a control signal, to turn on the main switch with a particular time-delay relative to the zero crossing of the voltage between the two switch terminals, the controller including a rectifier type power supply unit having a first input connected directly to a first of the two switch terminals and a second input connected to the second switch terminal via a capacitor adapted to limit the current in the power supply unit.

2. Description of the Prior Art

Switches of this type are usually called two-wire power supply switches because the circuit requires only two wires.

Given that, in a circuit of this kind, when the main switch is on, the instantaneous voltage between the two terminals of the switch, and consequently the instantaneous voltage at the input of the power supply unit, is practically zero, the controller would no longer be supplied with power if the switch were turned on at the time of the zero crossing of the voltage between the two terminals. Accordingly, it is turned on with a particular time-delay relative to this zero crossing so that an approximately triangular voltage appears between the terminals of the switch, the peak of which corresponds to the elongation of the voltage between the terminals of the switch at the time which precedes the triggering of the main switch. The impedance of the load being usually negligible compared to that of the power supply unit of the controller, as long as the main switch is not turned on the voltage between the terminals of the switch is the mains supply voltage, with the result that the turn-on time-delay and the peak voltage between the terminals of the switch are strictly related.

It goes without saying that the power supply unit of the controller must provide the latter with a relatively stable DC voltage, despite variations in the voltage between the inputs of the power supply unit according to whether the switch is open or closed; in addition to voltage stabilizing components downstream of the rectifier (the seat of dissipative losses increasing in direct proportion to the variations suppressed), this requires an impedance in series with the input of the power supply unit, advantageously a reactive impedance so as not to dissipate energy. In practice this impedance is obtained with a capacitor, that referred to hereinabove as being adapted to limit the current in the power supply unit.

The current limitation is of benefit mostly when the switch is open, when the voltage between the inputs of the power supply unit is practically the same as the voltage between the poles of the mains supply, whereas when the switch is closed, the voltage applied between the inputs of the power supply unit is reduced to that of the mains supply between each zero crossing of the latter and the consecutive turning on of the main switch, i.e. during the time-delay. During this brief time period the capacitor must allow sufficient energy to pass to the power supply unit (all the more so in that the controller often consumes more energy when the switch is closed) This leads to the use of a relatively bulky and costly capacitor, unless the turn-on time-delay is increased excessively.

An objective of the invention is to reduce the overall size of the switch by reducing that of the current limiter capacitor and by reducing dissipation of energy in the components of the switch.

SUMMARY OF THE INVENTION

The above objective is achieved with a switch adapted to be connected in series with a load between two poles of an alternating current mains electrical power supply, having two terminals adapted to be connected to one pole of said mains supply and to said load, respectively, said load being connected to the other pole of said mains supply, and including a triggered bidirectional conduction main switch connected between said two terminals and a controller adapted, in response to an active state of a command signal, to turn on said main switch with a particular time-delay relative to the zero crossing of the voltage between said two terminals, said controller including a rectifier power supply unit having a first input connected directly to a first terminal and a second input connected to the second terminal via a capacitor adapted to limit the current in said power supply unit, wherein said controller includes a triggered bidirectional conduction auxiliary switch shunting said capacitor, said auxiliary switch being turned on at the time of each zero crossing of the voltage between said two terminals with said command signal in an active state.

Accordingly, when the switch is closed, the capacitor is short-circuited by the auxiliary switch and does not limit the energy absorbed by the power supply unit; the latter is then in proportion to the energy supplied to the controller, at a DC voltage substantially corresponding to the voltage elongation at the input of the power supply unit at the time the main switch is turned on. The value of the capacitor can therefore be chosen to maintain the voltage rectified by the power supply unit, when the switch is open, when the voltage between the terminals of the latter is substantially the same as the (full wave) voltage between the poles of the mains supply, and no more than this.

Accordingly, both when the switch is closed and when it is open, the power supply unit receives a measured quantity of energy to maintain an appropriate value of the rectified voltage that it delivers.

This reduces the value of the current limiter capacitor, and therefore its overall size, and minimizes the energy dissipation caused by stabilizing the rectified voltage, which reduces the overall size and cost of the dissipative components.

The main and auxiliary switches are preferably triacs with a trigger triggering conduction in both directions, so as to minimize the number of components of the switch.

The main switch is preferably turned on by a voltage derived from the voltage between the inputs of the power supply unit crossing a preset level. Although, as previously mentioned, the turn-on time-delay and the peak voltage at turn-on time are strictly related, turn-on when the voltage crosses a preset level is technically simpler and reduces fluctuations of the voltage at the input of the power supply unit.

Secondary features and the advantages of the invention will emerge from the following description given by way of example with reference to the accompanying drawings.

DETAILED DESCRIPTION OF THE PREFERRED EMBODIMENT

Figure 1:
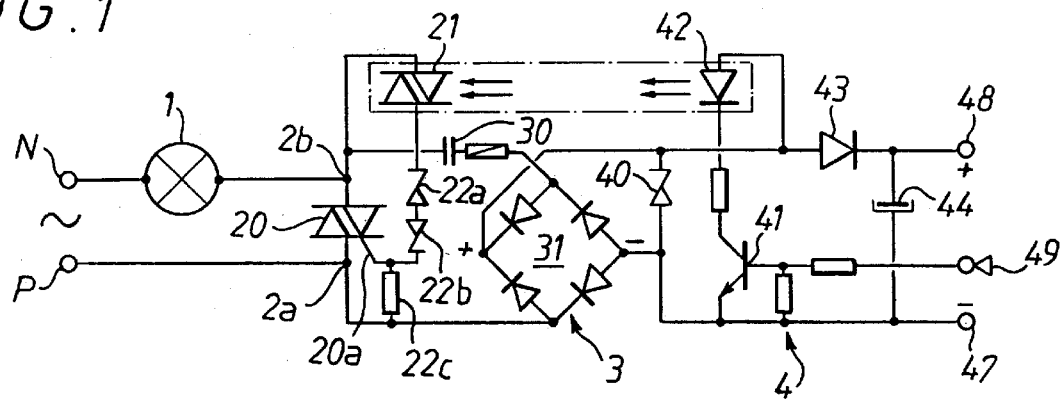
FIG. 1 is a schematic of a prior art two-way power supply switch.

The prior art two-wire power supply switch shown in FIG. 1 is connected in series with a load 1 between two poles P (phase) and N (neutral) of an alternating current mains electrical power supply. It has two terminals 2a and 2b, the terminal 2a being connected to the pole P and the terminal 2b to the load 1, the latter being connected to the pole N. A triac 20 constituting the main switch is connected between the terminals 2a and 2b, its trigger 20a being connected to the terminal 2b via two Zener diodes 22a and 22b connected in series and in opposite conduction directions and an optotriac 21. The switch further includes a rectifier 3 comprising a bridge 31 with a first input connected to the terminal 2b directly and a second input connected to the terminal 2b through a capacitor 30 for limiting the current flowing through the rectifier bridge 31. The latter feeds a power supply unit 4 including a Zener diode 40 which peak limits the rectified voltage and a filter capacitor 44 on the output side of a non-return diode 43 so that the capacitor 44 is charged substantially to the breakdown voltage of the Zener diode 40 (24 volts). The power supply unit 4 has two output terminals, namely a negative terminal 47 and a positive terminal 48, from which power is supplied to auxiliary circuits of the switch, constituting with the power supply unit 4 a controller adapted to generate a control signal from data representative of the chosen conditions under which, in combination, the switch is closed and opened. The power supply unit further includes a device controlling closing of the switch which includes a light-emitting diode 42 with its anode connected to the positive output of the bridge 31 and its cathode connected via a resistor to the collector of a transistor 41 the emitter of which is connected to the negative output of the bridge 31. The light-emitting diode 42 is optically coupled to the optotriac 21 so that the optotriac 21 is turned on by the emission of light from the diode 42. The base of the transistor 41 receives a closing command signal from a control terminal 49, the active state of this signal being a voltage at the terminal 49 which is positive relative to the negative terminal 47.

The active state of the command signal at the terminal 49 turns on the transistor 41 and causes the diode 42 to emit light. The optotriac 21 is then turned on by the voltage between its terminals. The optotriac 21 receives the voltage between the terminals 2a and 2b via the Zener diodes 22a and 22b and the resistor 22c. Accordingly, the optotriac 21, illuminated by the light-emitting diode, is turned on when the instantaneous voltage between the terminals 2a and 2b reaches the breakdown voltage of one of the Zener diodes 22a and 22b, according to the direction of the instantaneous voltage between the two terminals 2a and 2b; it will be remembered that Zener diodes conduct for voltages in the opposite direction to their breakdown voltage. The conduction of the combination of the optotriac 21, Zener diodes 22a and 22b and resistor 22c injects charges into the trigger of the triac 20 (main switch) which turn it on. This is delayed relative to the zero crossing of the voltage between the terminals 2a and 2b for long enough for the AC line voltage to reach the breakdown voltage of the diodes 22a and 22b.

Figure 2:
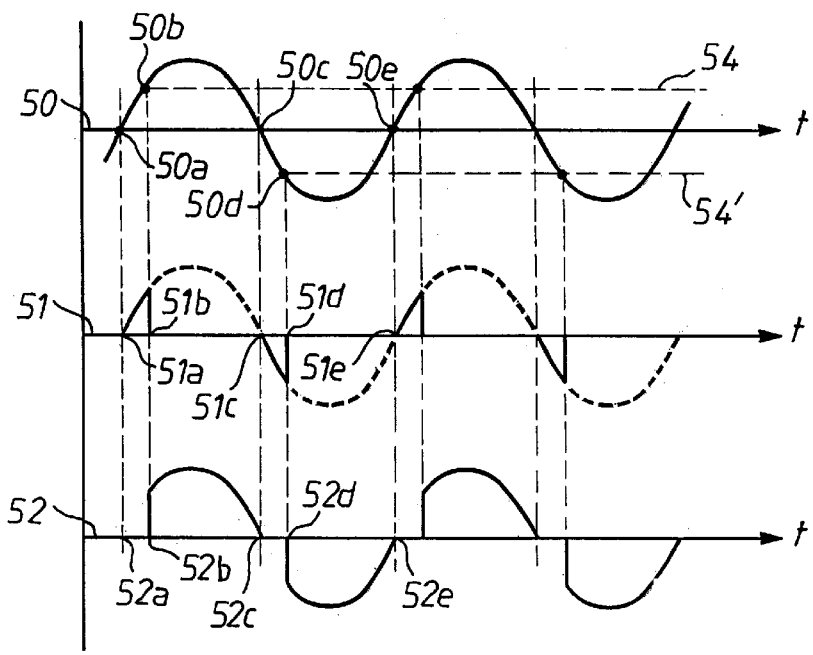
FIG. 2 is a diagram of the voltages between poles of the mains supply, between the terminals of a two-wire power supply switch, and at the load.

This becomes clear on referring to FIG. 2, in which the curve 50 represents the evolution of the voltage between the poles P and N of the mains supply, the curve 51 the voltage between the terminals 2a and 2b of the switch and the curve 52 the voltage at the terminals of the load 1. It goes without saying that the voltage which is the sum of the curves 51 and 52 is equal to the voltage of the curve 50.

It is assumed that the load 1 has an impedance with practically no reactive component. Accordingly, when the triac 20 is not turned on, the impedance between the terminals 2a and 2b is very high compared to that of the load 1 and the instantaneous voltage between the terminals 2a and 2b is practically equal to the AC line voltage, between the terminals P and N, which corresponds to the switch being open. On the contrary, when the triac 20 is turned on, the voltage between the terminals 2a and 2b is substantially zero and the voltage of the load 1 is practically the AC line voltage between the poles P and N, which corresponds overall to the switch being closed.

On the substantially sinusoidal curve 50 the dashed lines 54, 54' parallel to the abscissa axis represent the breakdown voltages of the diodes 22a and 22b, respectively. To simplify the figure, the ratio between the breakdown voltages and the amplitude of the AC line voltage is exaggerated. In practice the breakdown voltages are in the order of 30 volts whereas the amplitude of the 220 V AC line voltage is about 310 volts.

The zero crossings of the AC line voltage 50, for a full wave, are the points 50a, 50c, 50e. The crossing of the level 54 is the point 50b and the crossing of the level 54' is the point 50d. In curves 51 and 52 the indices are the same for synchronous points.

Considering the voltage 51 between the terminals 2a and 2b of the switch, it can be seen that it increases from zero at point 51a and is sharply cut off at point 51b, because the triac 20 is turned on, and remains at zero as far as point 51c, then decreasing as far as the point 51d where it reaches the level 54' and goes to zero as far as point 51e.

The voltage 52 is the complement of the voltage 51 for the AC line voltage 50, between the terminals 2a, 2b, i.e. zero from point 52a to point 52b, where it suddenly rises to the level 54 to reproduce the remainder of the half-wave up to the point 52c at which it falls to zero; it remains at zero as far as the point 52d where it goes to level 54' to reproduce the remainder of the second half-wave as far as the point 52e. Taking into consideration the ratio indicated hereinabove between the level of the voltage turning on the triac 20 and the amplitude of the AC line voltage, the turn-on time-delay is about 0.73 ms for a 50 Hz mains supply. The voltage 51 between the terminals 2a and 2b is similar to a series of triangular pulses of alternating sign and short duration, whereas the voltage 52 at the terminals of the load 1 is practically sinusoidal.

However, when the command signal input terminal 49 is at the same potential as the negative terminal 47 of the power supply unit 4 (command signal inactive), the voltage between the terminals 2a and 2b is at all times the AC line voltage.

Consequently, the rectifier 3 at the input of the power supply unit 4 receives, via the capacitor 30, either a full-wave AC voltage 50 or a series of triangular pulses of alternating sign with a low peak voltage and a short duration compared to the period of the mains supply 51, according to whether the switch is open or closed, respectively.

The value of the capacitor 30 must be such that:

In the open condition, the voltage between the inputs of the rectifier bridge 31 is limited to avoid overloading the power supply unit, in particular to limit the current in the Zener diode 40.

In the closed condition, the energy injected in the bridge 31 and the power supply unit 4 via the capacitor 30 by the series of triangular pulses 51 must be sufficient to maintain the capacitor 44 charged despite the consumption of the controller.

In practice the capacitor 30 has to have a value which leads to significant losses in the open condition if the controller is to be supplied with power correctly in the closed condition; these losses necessitate overrating of the components concerned, while the power delivered to the controller in the closed condition is limited, which limits the functions of the controller. Consideration could be given to increasing the power available in the closed condition by increasing the time-delay on turning on the main switch by increasing the breakdown voltage of the Zener diodes 22a, 22b. This possibility is also limited, however, because the nominal voltage delivered by the power supply unit 4 must be compatible with the rated voltages of the components used in the controller; the triangular voltage peak (curve 51) is certainly higher than the nominal voltage of the power supply unit, but must be of the same order of magnitude so that increasing the voltage at the input of the power supply unit does not merely increase the losses.

Figure 3:
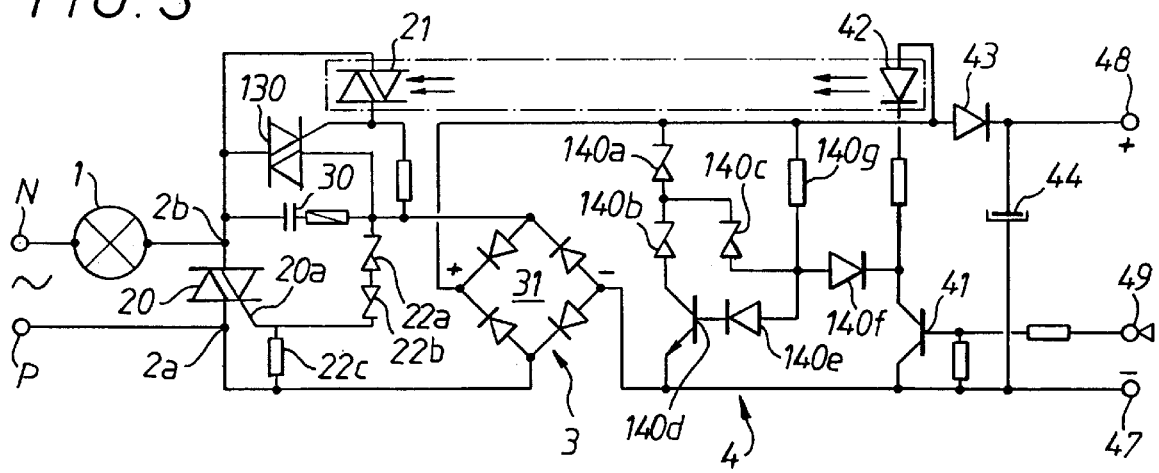
FIG. 3 is a schematic of a switch in accordance with the invention.

In the selected embodiment of the invention shown in FIG. 3a triac 130 shunts the capacitor 30 and its trigger is connected to the optotriac 21, the triac 130 constituting an auxiliary switch.

The power supply unit 4 includes, in addition to the transistor 41, which receives at its base the command signal applied to the terminal 49, a second transistor 140d the emitter of which is connected to the negative output of the bridge 31 and the collector of which is connected to the negative output of this bridge via two Zener diodes in series with the same conduction direction, namely a diode 140a connected to the positive output of the bridge 31 and a diode 140b connected to the collector of the transistor 140d. The common point of the diodes 140a and 140b is connected to a third Zener diode 140c conducting in the same direction as diode 140a. This Zener diode 140c is connected to a resistor 140g connected to the positive output of the bridge 31. The common point of the Zener diode 140c and the resistor 140g is connected to two diodes 140e and 140f respectively conducting towards the base of the transistor 140d and towards the collector of the transistor 41.

Operation is as follows:

When the command signal is inactive, the triac is turned off and the rectifier 3 receives the full wave from the mains supply via the load 1 and the capacitor 30, the latter being rated merely for the rectifier 31 to maintain the charge on the capacitor 44.

In the power supply unit 4, the transistor 41 is turned off. The base of the transistor 140d is connected via the diode 140e and the resistor 140g to the positive output of the rectifier bridge 31 and this transistor is therefore turned on. The series-connected Zener diodes 140a and 140b, each of which has a breakdown voltage of about 12 volts, are substituted for the Zener diode 40 from FIG. 1, with a breakdown voltage of 24 volts.

If an active command signal appears at this time at the terminal 49, the transistor 41 is turned on and the light-emitting diode 42 emits light. The optotriac 21 is turned on at the time of the next zero crossing of the voltage between the terminals 2a and 2b, the optotriac 21 being connected to the terminal 2b directly and also via a resistor and the rectifier bridge 31 to the terminal 2a. The triac 130 is turned on and short-circuits the capacitor 30, thus applying the full voltage between the terminals 2a and 2b to the inputs of the rectifier bridge 31.

In parallel with this, the fact that the transistor 41 is turned on turns off the transistor 140d. The voltage at the output of the rectifier bridge 31 is then limited by the series-connected Zener diodes 140a (12 V) and 140c (20 V) to about 32 volts.

As the breakdown voltage of the Zener diodes 22a and 22b is 30 volts, i.e. slightly less than the sum of the breakdown voltages of the Zener diodes 140a and 140c, the triac 20 (main switch) turns on just before the Zener diodes 140a and 140c limit the voltage at the rectifier bridge 31. The operation of the triac 20 is unchanged compared to the prior art circuit shown in FIG. 1. The triac 20 then short-circuits the switch terminals 2a and 2b. The voltage at the triac 130 (auxiliary switch) is also eliminated and it turns off.

The same process occurs on each half-wave.

Accordingly, the value of the capacitor 30 can be determined exclusively to maintain the voltage provided by the power supply unit 4 between the output terminals 47 and 48 when the switch is open with the control signal at the terminal 49 inactive. The power that the controller can absorb when the switch is closed becomes essentially dependent on the time-delay for turning on the triac 20 and the value of the filter capacitor 44.

Although the description mentions only triacs as the main and auxiliary switches (20 and 130), in particular because the trigger can then command conduction in both directions, it is obvious that any triggered conduction semiconductor circuit enabling bidirectional conduction, such as an anti-parallel combination of thyristors, can be used to implement the invention.

Also, the invention is of course not limited to the examples described but encompasses all variant executions thereof within the scope of the claims.

There is claimed:

1. A switch adapted to be connected in series with a load between two poles of an alternating current mains electrical power supply, having two terminals adapted to be connected to one pole of said mains supply and to said load, respectively, said load being connected to the other pole of said mains supply, and including a triggered bidirectional conduction main switch connected between said two terminals and a controller adapted, in response to an active state of a command signal, to turn on said main switch with a particular time-delay relative to the zero crossing of the voltage between said two terminals, said controller including a rectifier power supply unit having a first input connected directly to a first terminal and a second input connected to the second terminal via a capacitor adapted to limit the current in said power supply unit, wherein said controller includes a triggered bidirectional conduction auxiliary switch shunting said capacitor, said auxiliary switch being turned on at the time of each zero crossing of the voltage between said two terminals with said command signal in an active state.

2. The switch claimed in claim 1 wherein said main and auxiliary switches are triacs with a trigger triggering conduction in both directions.

3. The switch claimed in claim 1 wherein said main switch is turned on by a voltage derived from the voltage between said inputs of said power supply unit crossing a preset level.

4. The switch claimed in claim 3 wherein said main switch has a trigger receiving said voltage derived from said voltage at said input of said power supply unit via two series-connected Zener diodes with opposite conduction directions.

5. The switch claimed in claim 3 wherein said power supply includes a rectifier bridge charging a filter capacitor via a non-return diode and a transistor connected to at least one Zener diode forming a rectified voltage limiter.

6. The switch claimed in claim 5 wherein said controller further includes a transistor adapted to be turned on by said active state of said command signal and connected in series with a light-emitting diode connected to the output of said rectifier upstream of said non-return diode and optically coupled to a phototriac adapted, when conducting, to turn on said auxiliary switch.

* * * * *